US006811474B2

United States Patent
Cherian et al.

(10) Patent No.: US 6,811,474 B2
(45) Date of Patent: Nov. 2, 2004

(54) POLISHING COMPOSITION CONTAINING CONDUCTING POLYMER

(75) Inventors: Isaac K. Cherian, Aurora, IL (US); Jian Zhang, Aurora, IL (US); Fred Sun, Naperville, IL (US); Shumin Wang, Naperville, IL (US); Eric H. Klingenberg, Emmaus, PA (US)

(73) Assignee: Cabot Microelectronics Corporation, Aurora, IL (US)

( * ) Notice: Subject to any disclaimer, the term of this patent is extended or adjusted under 35 U.S.C. 154(b) by 10 days.

(21) Appl. No.: 10/199,704

(22) Filed: Jul. 19, 2002

(65) Prior Publication Data

US 2004/0014400 A1 Jan. 22, 2004

(51) Int. Cl.$^7$ ................................................. B24B 5/00
(52) U.S. Cl. ........................ 451/285; 451/41; 451/288
(58) Field of Search ........................ 451/41, 285, 287, 451/288, 36, 59, 63; 51/295

(56) References Cited

U.S. PATENT DOCUMENTS

| | | |
|---|---|---|
| 4,983,650 A | 1/1991 | Sasaki |
| 5,264,010 A | 11/1993 | Brancaleoni et al. |
| 5,352,277 A | 10/1994 | Sasaki |
| 5,489,233 A | 2/1996 | Cook et al. |
| 5,527,423 A | 6/1996 | Neville et al. |
| 5,860,848 A | 1/1999 | Loncki et al. |
| 5,958,794 A | 9/1999 | Bruxvoort et al. |
| 6,062,968 A | 5/2000 | Sevilla et al. |
| 6,117,000 A | 9/2000 | Anjur et al. |
| 6,126,532 A | 10/2000 | Sevilla et al. |
| 6,303,049 B1 | 10/2001 | Lee et al. |
| 6,348,076 B1 | 2/2002 | Canaperi et al. |
| 6,379,223 B1 | 4/2002 | Sun et al. |
| 6,454,819 B1 * | 9/2002 | Yano et al. .................... 51/298 |
| 6,468,785 B1 * | 10/2002 | Wang et al. ............. 435/287.2 |

FOREIGN PATENT DOCUMENTS

| | | |
|---|---|---|
| EP | 0 919 602 A1 | 6/1999 |
| EP | 0 840 664 B1 | 3/2001 |
| JP | 2003017446 * | 1/2003 |

* cited by examiner

Primary Examiner—Eileen P. Morgan
(74) Attorney, Agent, or Firm—Kristen Harrell

(57) ABSTRACT

The invention provides a polishing system comprising (a) an abrasive, a polishing pad, a means for oxidizing a substrate, or any combination thereof, (b) a conducting polymer having an electrical conductivity of about $10^{-10}$ S/cm to about $10^6$ S/cm, and (c) a liquid carrier.

21 Claims, No Drawings

POLISHING COMPOSITION CONTAINING CONDUCTING POLYMER

FIELD OF THE INVENTION

This invention pertains to a polishing system comprising a conducting polymer.

BACKGROUND OF THE INVENTION

Compositions and methods for polishing (e.g., planarizing) the surface of a substrate are well known in the art. Polishing compositions (also known as polishing slurries) typically contain an abrasive material in an aqueous solution and are applied to a surface by contacting the surface with a polishing pad saturated with the polishing composition. Typical abrasive materials include silicon dioxide, cerium oxide, aluminum oxide, zirconium oxide, and tin oxide. U.S. Pat. No. 5,527,423, for example, describes a method for chemically-mechanically polishing (CMP) a metal layer by contacting the surface with a polishing composition comprising high purity fine metal oxide particles in an aqueous medium. The polishing composition is typically used in conjunction with a polishing pad (e.g., polishing cloth or disk). Suitable polishing pads are described in U.S. Pat. Nos. 6,062,968, 6,117,000, and 6,126,532, which disclose the use of sintered polyurethane polishing pads having an open-celled porous network, and U.S. Pat. No. 5,489,233, which discloses the use of solid polishing pads having a surface texture or pattern. Alternatively, the abrasive material may be incorporated into the polishing pad. U.S. Pat. No. 5,958,794 discloses a fixed abrasive polishing pad.

The chemical additives in polishing compositions play an important role in the polishing of substrates. While chemical additives can increase the removal rate of substrate material in polishing a substrate's surface, the chemical additives can adversely affect surface planarity and corrosion of the substrate. Therefore, it is desirable to formulate polishing compositions that can rapidly polish substrate surfaces without significantly adversely affecting the surface planarity or corrosion of the substrate.

Polymers are one type of chemical additive that has been used as a component of polishing compositions. Polymers can serve in various roles in the polishing compositions such as surfactants or polyelectrolytes (see, for example, U.S. Pat. Nos. 5,264,010, 5,860,848, 5,958,794, 6,303,049, and 6,348,076 and EP 0919602). For instance, U.S. Pat. No. 5,352,277 discloses a polishing composition, for polishing silicon wafers used in integrated circuits, comprising water, silica, a water-soluble salt, and a water-soluble polymer. The water-soluble polymer can be polyethylene oxide, polyacrylamide, polyvinyl pyrrolidone, poly(meth)acrylic acid, or polymaleic acid. In addition, U.S. Pat. No. 4,983,650 describes polishing compositions for polishing wafers comprising water, silica, and a polysaccharide graft-polymerized with acrylamide alone or together with at least one vinyl monomer (e.g., (meth)acrylic acid, styrenesulfonic acid). EP 0840664 discloses a polishing composition for silicon wafers comprising water, silica, salt, an amine compound, and a polyelectrolyte dispersion (e.g., polyvinyl alcohol, polyethylene oxide).

A need remains, however, for polishing systems and polishing methods that will exhibit desirable planarization efficiency, selectivity, uniformity, and removal rate during the polishing and planarization of substrates, in particular metal substrates, while minimizing defectivity, such as surface imperfections and damage to underlying structures and topography during polishing and planarization.

The invention seeks to provide such a polishing system and method. These and other advantages of the invention will be apparent from the description of the invention provided herein.

BRIEF SUMMARY OF THE INVENTION

The invention provides a polishing system comprising (a) an abrasive, a polishing pad, a means for oxidizing a substrate, or any combination thereof, (b) a conducting polymer, and (c) a liquid carrier, wherein the conducting polymer has an electrical conductivity of about $10^{-10}$ S/cm to about $10^6$ S/cm. The invention further provides a chemical-mechanical polishing composition comprising (a) an abrasive, a polishing pad, or both an abrasive and a polishing pad, (b) a conducting polymer, and (c) a liquid carrier, wherein the conducting polymer has an electrical conductivity of about $10^{-10}$ S/cm to about $10^6$ S/cm. Further provided is an electrochemical polishing system comprising (a) a means for oxidizing a substrate, (b) a conducting polymer, and (c) a liquid carrier, wherein the conducting polymer has an electrical conductivity of about $10^-$ S/cm to about $10^6$ S/cm.

DETAILED DESCRIPTION OF THE INVENTION

The invention provides a polishing system comprising (a) an abrasive, a polishing pad, a means for oxidizing a substrate, or any combination thereof, (b) a conducting polymer, and (c) a liquid carrier, wherein the conducting polymer has an electrical conductivity of about $10^{-10}$ S/cm to about $10^6$ S/cm. The polishing system can be a chemical-mechanical polishing (CMP) system or an electrochemical polishing system. It has been found that a conducting polymer in a polishing (e.g., CMP or electrochemical polishing) composition can prevent substrate corrosion and enhance substrate surface planarity by decreasing dishing, recess, and erosion of the substrate during polishing. By contrast, the presence of a nonconducting polymer, rather than conducting polymer, in the polishing system can result in a heterogeneous (i.e., random) surface potential distribution on the surface of the substrate that is being polished with the polishing system. That heterogeneous surface potential distribution, in turn, can lead to localized areas of corrosion and/or increased dishing, recess, and erosion on the substrate surface during the polishing of the substrate.

The polishing system comprises an abrasive, a polishing pad, a means for oxidizing a substrate, or any combination thereof. A CMP system typically will contain an abrasive, a polishing pad, or both an abrasive and a polishing pad, but also can contain a means for oxidizing a substrate. An electrochemical polishing system typically will contain a means for oxidizing a substrate, but also can contain an abrasive, a polishing pad, or both an abrasive and a polishing pad (although in preferred instances an abrasive and a polishing pad are not required). Preferably, particularly in a CMP system, the system comprises both an abrasive and a polishing pad. The abrasive (when present and suspended in the liquid carrier) and the conducting polymer, as well as any other components suspended in the liquid carrier, form the polishing composition of the polishing system.

The abrasive can be in any suitable form (e.g., abrasive particles). The abrasive can be fixed on the polishing pad and/or can be in particulate form and suspended in the liquid carrier. The abrasive can be of any suitable material (e.g., a metal oxide). For example, the abrasive can be a metal oxide abrasive selected from the group consisting of alumina, silica, titania, ceria, zirconia, germania, magnesia, co-formed products thereof, and combinations thereof. The abrasive also can be a polymer particle or a coated particle. Typically, the abrasive is selected from the group consisting of alumina, silica, co-formed products thereof, coated metal oxide particles, polymer particles, and combinations thereof. Preferably, the abrasive is alumina or silica. The polishing system typically comprises about 0.1 wt. % to about 20 wt. % (e.g., about 0.5 wt. % to about 20 wt. %, about 0.5 wt. % to about 15 wt. %, or about 1 wt. % to about 10 wt. %) abrasive, based on the weight of the liquid carrier and any compounds dissolved or suspended therein.

The polishing pad can be any suitable polishing pad. Suitable polishing pads are described in U.S. Pat. Nos. 5,489,233, 6,062,968, 6,117,000, and 6,126,532.

The means for oxidizing the substrate can be any suitable means for oxidizing the substrate, which includes any physical or chemical means. In electrochemical polishing systems preferably the means for oxidizing the substrate comprises a device for applying a time-varying anodic potential to the substrate (e.g., electronic potentiostat). In CMP systems, preferably the means for oxidizing the substrate is a chemical oxidizing agent.

The device for applying time-varying anodic potential to the substrate can be any suitable such device. The means for oxidizing the substrate preferably comprises a device for applying a first, higher anodic potential during an initial stage of the polishing and applying a second, lower anodic potential at or during a later stage of polishing, or a device for reducing a first, higher anodic potential to a second, lower anodic potential during an intermediate stage of polishing, e.g., continuously reducing the anodic potential during the intermediate stage or rapidly reducing the anodic potential from a first, higher potential to a second, lower potential after a predetermined interval at the first, higher potential. For example, during the initial stage(s) of the polishing, a relatively high anodic potential is applied to the substrate to promote a relatively high rate of oxidation/dissolution/removal of the substrate. When polishing is at a later stage, e.g., when approaching an underlying barrier layer, the applied anodic potential is reduced to a level producing a substantially lower or negligible rate of oxidation/dissolution/removal of the substrate, thereby eliminating or substantially reducing dishing, corrosion, and erosion. The time-varying electrochemical potential is preferably applied using a controllably variable DC power supply, e.g., an electronic potentiostat. U.S. Pat. No. 6,379,223 further describes a means for oxidizing a substrate by applying a potential.

The chemical oxidizing agent can be any suitable oxidizing agent. Suitable oxidizing agents include inorganic and organic per-compounds, bromates, nitrates, chlorates, chromates, iodates, iron and copper salts (e.g., nitrates, sulfates, EDTA, and citrates), rare earth and transition metal oxides (e.g., osmium tetraoxide), potassium ferricyanide, potassium dichromate, iodic acid, and the like. A per-compound (as defined by Hawley's Condensed Chemical Dictionary) is a compound containing at least one peroxy group (—O—O—) or a compound containing an element in its highest oxidation state. Examples of compounds containing at least one peroxy group include but are not limited to hydrogen peroxide and its adducts such as urea hydrogen peroxide and percarbonates, organic peroxides such as benzoyl peroxide, peracetic acid, and di-tert-butyl peroxide, monopersulfates ($SO_5^{2-}$), dipersulfates ($S_2O_8^{2-}$), and sodium peroxide. Examples of compounds containing an element in its highest oxidation state include but are not limited to periodic acid, periodate salts, perbromic acid, perbromate salts, perchloric acid, perchlorate salts, perboric acid, perborate salts, and permanganates. The oxidizing agent preferably is hydrogen peroxide. The polishing system, especially the CMP system (particularly the polishing composition), typically comprises about 0.1 wt. % to about 15 wt. % (e.g., about 0.2 wt. % to about 10 wt. %, about 0.5 wt. % to about 8 wt. %, or about 1 wt. % to about 5 wt. %) oxidizing agent, based on the weight of the liquid carrier and any compounds dissolved or suspended therein.

The conducting polymer is any suitable conducting polymer, preferably a conducting polymer that, upon addition to the polishing system, provides an effective removal rate of the substrate surface being polished without diminishing the quality of the substrate surface planarity. For example, the addition of the conducting polymer to the polishing system can result in a slight decrease of removal rate compared to a polishing system without such a conducting polymer as long as other properties such as dishing, erosion, recess, or corrosion are minimized. Preferably, addition of the conducting polymer in the polishing system has no substantial effect on the removal rate compared to conventional polishing systems. More preferably, addition of the conducting polymer to the polishing system results in an increase in the removal rate of the substrate compared to conventional polishing systems that do not contain a conducting polymer.

Typically, the conducting polymer is formed from organic monomers and has a π-conjugated system along the polymer backbone, which is formed by the overlap of carbon $p_z$ orbitals and alternating carbon-carbon bond lengths. In some conducting polymers, such as, for example, polyaniline, nitrogen $p_z$ orbitals and $C_6$ rings also are part of the π-conjugation path.

Conducting polymers that are suitable additives to the polishing (e.g., CMP or electrochemical polishing) system have a conductivity (σ) in the range of about $10^{-10}$ S/cm to about $10^6$ S/cm (e.g., about $10^{-9}$ S/cm to about $10^5$ S/cm, about $10^{-8}$ S/cm to about $10^3$ S/cm, about $10^{-5}$ S/cm to about $10^1$ S/cm, about $10^{-3}$ S/cm to about $10^{-1}$ S/cm). Preferably, the conducting polymer is selected from the group consisting of polypyrrole, polyaniline, polyanilinesulfonic acid, polythiophene, poly(phenylene) (ortho-, meta-, or para-, preferably para-), poly(phenylene-vinylene) (ortho-, meta-, or para-, preferably para-), poly(p-pyridine), poly(p-pyridyl-vinylene), poly(1,6-heptadiyne), polyacetylene (cis, trans, or mixtures thereof), polyisothianaphthene, poly-3,4-ethylene dioxythiophene, poly(N-vinylcarbazole), copolymers thereof, and combinations thereof. More preferably, the conducting polymer is polypyrrole or polyaniline. Most preferably, the conducting polymer is polypyrrole.

The conducting polymer can be undoped or doped, but preferably the conducting polymer is doped with either an n-type (i.e., a reductant) or p-type (i.e., an oxidant) dopant. Acceptable dopants are those that introduce mobile charge carriers into the backbone of the conducting polymer chains. The doping process allows the extra holes (due to oxidation) or the extra electrons (due to reduction) in the backbone of the polymer chains to move down the chain, thereby increasing the electrical conductivity. Suitable examples of an n-type dopant include Na, K, Li, Ca, an organic acid including, but not limited to, substituted and unsubstituted sulfonic acid (e.g., 2-acrylo-amido-1-propane sulfonic acid, dodecylbenzenesulfonic acid, and camphor sulfonic acid), and tetraalkylammonium (in which the alkyl is preferably $C_1$–$C_8$ linear or branched alkyl). Suitable examples of a p-type dopant include $I_2$, $PF_6$, $BF_6$, Cl, and $AsF_6$.

The polishing system typically comprises about 0.01 wt. % or more (e.g., about 0.1 wt. % or more, about 0.2 wt. % or more, about 0.5 wt. % or more, or about 1 wt. % or more) conducting polymer, based on the weight of the liquid carrier and any compounds dissolved or suspended therein. The polishing system also typically comprises about 5 wt. % or less (e.g., about 4 wt. % or less, about 3 wt. % or less, or about 2 wt. % or less) conducting polymer, based on the weight of the liquid carrier and any compounds dissolved or suspended therein.

A liquid carrier is used to facilitate the application of the abrasive (when present and suspended in the liquid carrier), conducting polymer, and any optional additives to the surface of a suitable substrate to be polished (e.g., planarized). The liquid carrier is typically an aqueous carrier and can be water alone, can comprise water and a suitable water-miscible solvent, or can be an emulsion. Suitable water-miscible solvents include alcohols such as methanol, ethanol, etc. Preferably, the aqueous carrier consists of water, more preferably deionized water.

The polishing composition can have any suitable pH. Typically, the polishing composition has a pH of about 9 or lower (e.g., about 8 or lower, about 7 or lower, about 6 or lower, about 5 or lower, or about 4 or lower). Preferably, the polishing composition has a pH of about 1 to about 9, more preferably about 1 to about 7. The actual pH of the polishing composition will depend, in part, on the type of substrate being polished.

The polishing system (particularly the polishing composition) optionally further comprises a chelating or complexing agent. The complexing agent is any suitable chemical additive that enhances the removal rate of the substrate layer being removed. Suitable chelating or complexing agents can include, for example, carbonyl compounds (e.g., acetylacetonates, and the like), simple carboxylates (e.g., acetates, aryl carboxylates, and the like), carboxylates containing one or more hydroxyl groups (e.g., glycolates, lactates, gluconates, gallic acid and salts thereof, and the like), di-, tri-, and poly-carboxylates (e.g., oxalates, phthalates, citrates, succinates, tartrates, malates, edetates (e.g., dipotassium EDTA), polyacrylates, mixtures thereof, and the like), carboxylates containing one or more sulfonic and/or phosphonic groups, and the like. Suitable chelating or complexing agents also can include, for example, di-, tri-, or polyalcohols (e.g., ethylene glycol, pyrocatechol, pyrogallol, tannic acid, and the like) and amine-containing compounds (e.g., ammonia, amino acids, amino alcohols, di-, tri-, and polyamines, and the like). Preferably, the complexing agent is a carboxylate salt, more preferably an oxalate salt. The choice of chelating or complexing agent will depend on the type of substrate layer being removed. The polishing system (particularly the polishing composition) typically comprises about 0.1 wt. % to about 20 wt. % (e.g., about 0.5 wt. % to about 20 wt. %, about 0.5 wt. % to about 15 wt. %, or about 1 wt. % to about 10 wt. %) complexing agent, based on the weight of the liquid carrier and any compounds dissolved or suspended therein.

The invention also provides a method of polishing a substrate with the polishing system described herein. The method of polishing a substrate comprises (i) contacting a substrate with the aforementioned polishing system, and (ii) abrading or removing at least a portion of the substrate to polish the substrate.

In particular, the invention provides a method of chemically-mechanically polishing a substrate comprising contacting (i) a substrate with a polishing system comprising (a) an abrasive, a polishing pad, or both an abrasive or a polishing pad, (b) a conducting polymer, and (c) a liquid carrier, wherein the conducting polymer has an electrical conductivity of about $10^{-10}$ S/cm to about $10^6$ S/cm, and (ii) abrading at least a portion of the substrate to polish the substrate. The invention further provides a method of electrochemically polishing a substrate comprising (i) contacting a substrate with a polishing system comprising (a) a means for oxidizing a substrate, (b) a conducting polymer, and (c) a liquid carrier, wherein the conducting polymer has an electrical conductivity of about $10^{-10}$ S/cm to about $10^6$ S/cm, and (ii) removing at least a portion of the substrate to polish the substrate.

The substrate can be any suitable substrate (e.g., an integrated circuit, memory or rigid disks, metals, ILD layers, semiconductors, micro-electro-mechanical systems, ferroelectrics, magnetic heads, polymeric films, and low and high dielectric constant films). Preferably the substrate comprises a metal; more preferably the substrate comprises a metal that can be oxidized. The substrate can contain any suitable insulating and/or conductive layers. The insulating layer can be a metal oxide, porous metal oxide, glass, organic polymer, fluorinated organic polymer, or any other suitable high or low-κ insulating layer. The insulating layer preferably comprises silicon oxide, silicon nitride, silicon oxynitride, silicon carbide, aluminum oxide, or a material with a dielectric constant of about 3.5 or less. The conductive layer can be a metal or metal alloy layer (e.g., metal conductive layer). The metal layer can comprise any suitable metal. For example, the metal layer can comprise copper, tantalum, titanium, aluminum, nickel, platinum, ruthenium, iridium, or rhodium. Preferably, the metal layer comprises copper, tungsten, and/or aluminum.

Without wishing to be bound by any particular theory, it is believed that a conducting polymer doped with a p-type dopant passivates the metal surface of the substrate (e.g., Cu, W, Al, etc.). The p-type doped conducting polymer enables the formation and then subsequent removal of a metal oxide layer at an overall increased removal rate. In addition, the conducting polymer can potentially promote the charge transfer between anodic dissolution and reduction of the oxidizer at the cathode. Alternatively, conducting polymers doped with n-type dopants can supply electrons to the substrate and inhibit dissolution of the metal (e.g., Cu) by cathodic protection.

It is further believed that a polishing system (particularly the polishing composition) that contains a conducting polymer, in particular, a doped conducting polymer, forms a homogeneous potential distribution across the conducting film formed on the substrate's surface due to the delocalization of the electrons in the conjugated polymer backbone. The homogeneous potential across the entire substrate surface allows for a decrease in localized areas of corrosion on the substrate's surface. In addition, dishing, erosion, and recess that are directly caused by any heterogeneity of the surface film (e.g., due to the use of non-conducting polymers) are reduced or eliminated.

The conducting polymer also or alternatively can interact with an abrasive present in the polishing system by forming a coating on the exterior (i.e., exposed surface) of the abrasive (especially when the abrasive is in the form of particles). The coated abrasive can then interact with the surface of the substrate by acting as an electron withdrawing source (e.g., p-type doped conducting polymer) or electron donating source (e.g., n-type doped conducting polymer), and/or by forming an electrically conductive film across the substrate's surface.

EXAMPLE

This example further illustrates the invention but, of course, should not be construed as in any way limiting its scope. In particular, this example illustrates the effect on the polishing of a copper substrate resulting from the use of a CMP system containing a conducting polymer.

Similar substrates comprising copper were polished with different polishing compositions in conjunction with a polishing pad under similar polishing conditions using a downforce pressure of 14 or 28 kPa (2 or 4 psi) on the substrate against the polishing pad on a conventional polishing tool. Each of the polishing compositions had a pH of about 4 (adjusted by $NH_4OH$) and comprised 3.22 wt. % alumina (100 nm average diameter, Horiba LA 910/920), 3.58 wt. % urea, 1.36 wt. % tartaric acid, and 50 ppm Triton DF-16 surfactant. Polishing Compositions A and B (control) had no further components, while Polishing Compositions C and D (comparative) further comprised a non-conducting polymer, specifically 0.1 wt. % 1,2,4-triazole (which is a conventional copper inhibitor or film-forming agent), and Polishing Compositions E and F (invention) further comprised a conducting polymer, specifically 0.02 wt. % polypyrrole (p-type doped; σ=about $10^{-3}$ S/cm).

Polishing Compositions A and B were used to polish the substrate on the polishing tool both before and after Polishing Compositions C–F were used to polish similar substrates on the polishing tool. The effects of Polishing Compositions A–F during the polishing of the substrates were observed and recorded with respect to substrate removal rate, dishing (120 μm bond pad dishing), recess, and erosion. The erosion was the measurement of (a) E3-oxide erosion of a 90% density array in angstroms (4.5 μm line/0.5 μm space with 5 μm pitch array), and (b) E4-oxide erosion of a 50% density array in angstroms (2.5 μm line/2.5 μm space with 5 μm pitch array). The removal rate, dishing, clear time, average recess (0.3 μm), and erosion results are set forth in the Table.

(as exemplified by Polishing Compositions E and F) generally increases the removal rate as compared to conventional polishing systems (as exemplified by Polishing Compositions C and D), and decreases the dishing, recess, and erosion, as compared to similar polishing systems that do not include a conducting polymer (as exemplified by Polishing Compositions A and B). The polishing systems containing a conducting polymer had better dishing and erosion rates without sacrificing a good removal rate. While the presence of a non-conducting polymer such as 1,2,4-triazole in the polishing system (as exemplified by Polishing Compositions C and D) also decreased dishing and recess, the removal rate achieved with such a polishing composition was much less than that achieved with the similar polishing system that did not contain any polymer (cf. Polishing Compositions A and B).

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the

TABLE

| Polishing Composition | Downforce Pressure (kPa) | Removal Rate (Å/min) | Average Dishing (Å) | Clear Time (s) | Average Recess (Å) | Erosion 90% Density (Å) | Erosion 50% Density (Å) |
|---|---|---|---|---|---|---|---|
| A (control) | 14 | 7974 | 2276 | 123 | 825 | 1451 | 419 |
| B (control) | 14 | 11177* | 3019 | 110 | not determined | 1451 | 419 |
| C (comparative) | 14 | 4225 | 1537 | 190 | 195 | 1167 | 276 |
| D (comparative) | 28 | 8042 | 1834 | 151 | not determined | 1357 | 342 |
| E (invention) | 14 | 7156 | 2148 | 120 | 345 | 1232 | 372 |
| F (invention) | 28 | 10762 | 1942 | 118 | not determined | 1033 | 312 |
| A (repeat of control) | 14 | 7058 | 2848 | 120 | not determined | 1721 | 592 |
| B (repeat of control) | 28 | 10362 | 2757 | 130 | not determined | 1621 | 521 |

*measured at 28 kPa

The results summarized in the Table demonstrate that the presence of a conducting polymer in the polishing system specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A polishing system comprising:
   (a) a component selected from the group consisting of
       (i) an abrasive;
       (ii) an abrasive and a polishing pad;
       (iii) an abrasive, a polishing pad, and a means for oxidizing a substrate;
       (iv) an abrasive and a means for oxidizing a substrate;
       (v) a polishing pad;
       (vi) a polishing pad and a means for oxidizing a substrate; and
       (vii) a means for oxidizing a substrate,
   (b) a conducting polymer, and
   (c) a liquid carrier, wherein the conducting polymer has an electrical conductivity of about $10^{-10}$ S/cm to about $10^{6}$ S/cm.

2. The polishing system of claim 1, wherein the polishing system is a chemical-mechanical polishing system, wherein the component (a) is (i) an abrasive, (ii) an abrasive and a polishing pad, or (v) a polishing pad.

3. The polishing system of claim 2, wherein the conducting polymer is selected from the group consisting of polypyrrole, polyaniline, polyanilinesulfonic acid, polythiophene, poly(phenylene), poly(phenylene-vinylene), poly(p-pyridine), poly(p-pyridyl-vinylene), poly(1,6-heptadiyne), polyacetylene, polyisothianaphthene, poly-3,4-ethylene dioxythiophene, poly(N-vinylcarbazole), copolymers thereof, and combinations thereof.

4. The polishing system of claim 3, wherein the conducting polymer is polypyrrole or polyaniline.

5. The polishing system of claim 2, wherein the conducting polymer is undoped.

6. The polishing system of claim 2, wherein the conducting polymer is doped.

7. The polishing system of claim 6, wherein the conducting polymer is doped with an n-type or p-type dopant.

8. The polishing system of claim 7, wherein the conducting polymer is doped with an n-type dopant selected from the group consisting of Na, K, Li, Ca, an organic acid, and tetraalkylammonium.

9. The polishing system of claim 7, wherein the conducting polymer is doped with a p-type dopant selected from the group consisting of $I_2$, $PF_6$, $BF_6$, Cl, and $AsF_6$.

10. The polishing system of claim 2, wherein the liquid carrier comprises water.

11. The polishing system of claim 2, wherein the component (a) is (i) an abrasive or (ii) an abrasive and a polishing pad, and wherein the abrasive is suspended in the liquid carrier.

12. The polishing system of claim 11, wherein the abrasive is selected from the group consisting of alumina, silica, ceria, germania, titania, zirconia, magnesia, silicon nitride, silicon carbide, diamond, and combinations thereof.

13. The polishing system of claim 2, wherein the component (a) is (ii) an abrasive and a polishing pad, and wherein the abrasive is fixed on the polishing pad.

14. The polishing system of claim 2, wherein the conducting polymer is present in an amount of about 0.01 wt. % to about 5 wt. % based on the weight of the liquid carrier and any components suspended therein.

15. The polishing system of claim 2, wherein the component (a) is (i) an abrasive or (ii) an abrasive and a polishing pad, and wherein the abrasive is present in an amount of about 0.1 wt. % to about 20 wt. % based on the weight of the liquid carrier and any components suspended therein.

16. The polishing system of claim 2, wherein the system has a pH of about 9 or lower.

17. The polishing system of claim 1, wherein the polishing system is a chemical-mechanical polishing system, and wherein component (a) is (iii) an abrasive, a polishing pad, and a means for oxidizing a substrate, (iv) an abrasive and a means for oxidizing a substrate, or (vi) a polishing pad and a means for oxidizing a substrate.

18. The polishing system of claim 17, wherein the means for oxidizing a substrate is an oxidizing agent.

19. The polishing system of claim 2, wherein the system further comprises a complexing agent.

20. The polishing system of claim 1, wherein the polishing system is an electrochemical polishing system, and wherein component (a) is (iii) an abrasive, a polishing pad, and a means for oxidizing a substrate, (iv) an abrasive and a means for oxidizing a substrate, (vi) a polishing pad and a means for oxidizing a substrate, or (vii) a means for oxidizing a substrate.

21. The polishing system of claim 19, wherein the means for oxidizing a substrate comprises a device for applying a time-varying anodic potential to a substrate.

* * * * *